(12) United States Patent
Ikeda et al.

(10) Patent No.: US 7,842,168 B2
(45) Date of Patent: Nov. 30, 2010

(54) METHOD FOR PRODUCING SILICON OXIDE FILM AND METHOD FOR PRODUCING OPTICAL MULTILAYER FILM

(75) Inventors: Toru Ikeda, Yokohama (JP); Takahiro Mashimo, Yokohama (JP); Eiji Shidoji, Yokohama (JP); Toshihisa Kamiyama, Takasago (JP); Yoshihito Katayama, Yokohama (JP)

(73) Assignee: Asahi Glass Company, Limited, Tokyo (JP)

( * ) Notice: Subject to any disclaimer, the term of this patent is extended or adjusted under 35 U.S.C. 154(b) by 749 days.

(21) Appl. No.: 11/256,941

(22) Filed: Oct. 25, 2005

(65) Prior Publication Data

US 2006/0032739 A1     Feb. 16, 2006

Related U.S. Application Data

(63) Continuation of application No. PCT/JP2004/005875, filed on Apr. 23, 2004.

(30) Foreign Application Priority Data

Apr. 25, 2003 (JP) ............................. 2003-121527
Sep. 30, 2003 (JP) ............................. 2003-339748

(51) Int. Cl.
*C23C 14/00* (2006.01)
*C23C 14/32* (2006.01)

(52) U.S. Cl. ...................... 204/192.23; 204/192.15; 204/192.22; 204/192.26

(58) Field of Classification Search ............ 204/192.12; 359/883
See application file for complete search history.

(56) References Cited

U.S. PATENT DOCUMENTS

| | | | | |
|---|---|---|---|---|
| 5,814,195 | A * | 9/1998 | Lehan et al. | 204/192.12 |
| 6,511,584 | B1 * | 1/2003 | Szczyrbowski et al. | 204/192.22 |
| 6,744,425 | B2 * | 6/2004 | Yoshikawa et al. | 345/173 |
| 6,896,981 | B2 * | 5/2005 | Iwabuchi et al. | 428/698 |
| 2002/0117785 | A1 | 8/2002 | Mitsui et al. | |
| 2004/0240093 | A1 * | 12/2004 | Yoshikawa et al. | 359/883 |

FOREIGN PATENT DOCUMENTS

EP     08109473     4/1996

(Continued)

OTHER PUBLICATIONS

G. Bräuer, et al., "Mid Frequency Sputtering—A Novel Tool for Large Area Coating", Surface and Coatings Technology, Elsevier Science S.A., vol. 94-95, 1997, pp. 658-662.

*Primary Examiner*—Alexa D Neckel
*Assistant Examiner*—Michael Band
(74) *Attorney, Agent, or Firm*—Oblon, Spivak, McClelland, Maier & Neustadt, L.L.P.

(57) ABSTRACT

The invention provides a method for producing a silicon oxide film, whereby a film having uniform optical constants such as refractive index, absorption coefficient, etc. can be formed continuously at a high deposition rate.

A method for producing a silicon oxide film, which comprises depositing a silicon oxide film on a substrate by carrying out AC sputtering by using a sputtering target comprising silicon carbide and silicon with a ratio in number of atoms of C to Si being from 0.5 to 0.95, in an atmosphere containing an oxidizing gas, with an alternating current having a frequency of from 1 to 1,000 kHz.

20 Claims, 6 Drawing Sheets

FOREIGN PATENT DOCUMENTS

| | | |
|---|---|---|
| EP | 1 176 434 A1 | 1/2002 |
| JP | 10-8247 | 1/1998 |
| JP | 11-29863 | 2/1999 |
| JP | 2000104161 A * | 4/2000 |
| JP | 2001-234338 | 8/2001 |
| JP | 2002-155356 | 5/2002 |
| JP | 2003-13216 | 1/2003 |
| JP | 2003-27226 | 1/2003 |
| JP | 2003-121605 | 4/2003 |
| JP | 2003-121636 | 4/2003 |
| JP | 2003-121639 | 4/2003 |
| WO | WO 01/27345 A1 | 4/2001 |

* cited by examiner

FLOW RATE OF OXIDIZING GAS (sccm)

OXYGEN FLOW RATE (sccm)

OXYGEN FLOW RATE (sccm)

METHOD FOR PRODUCING SILICON OXIDE FILM AND METHOD FOR PRODUCING OPTICAL MULTILAYER FILM

TECHNICAL FIELD

The present invention relates to a method for producing a silicon oxide film and a method for producing an optical multilayer film employing it.

BACKGROUND ART

A silicon oxide film is used in various applications, as a low refractive index film. The silicon oxide film can be deposited by a vacuum evaporation method, a coating method, etc. However, in an application to e.g. glass for buildings, glass for automobiles, cathode ray tubes (CRT) or flat displays, sputtering is used in many cases, which is suitable for film deposition on a substrate having a large area.

Usually, in a case where a silicon oxide film is deposited by sputtering in an atmosphere containing oxygen by means of a Si target, it is known that the voltage changes depending upon the flow rate of oxygen to be added to the atmosphere, if the applied power is constant. FIG. 3 shows an example of the relation (the voltage change curve) between the voltage and the flow rate of oxygen added to the atmosphere in a case where a silicon oxide film is deposited by sputtering in an atmosphere containing argon and oxygen by means of a Si target. FIG. 3 is one obtained by increasing the oxygen flow rate in the atmosphere from a state where the oxygen flow rate is 0 sccm to the state where it is 80 sccm while maintaining the argon flow rate in the atmosphere to be constant at 125 sccm, and thereafter, reducing the oxygen flow rate to a state where the oxygen flow rate in the atmosphere is 0 sccm.

As shown in FIG. 3, if the oxygen flow rate is increased during the sputtering, at the initial stage, the voltage is substantially constant at a high value. However, when the oxygen flow rate reaches a certain level, the voltage decreases, and if the oxygen flow rate is further increased, the voltage becomes substantially constant at a low value. Inversely, if the oxygen flow rate is reduced, at the initial stage, the voltage is substantially constant at a low value, when the oxygen flow rate reaches a certain level, the voltage increases, and if the oxygen flow rate is further reduced, the voltage becomes substantially constant at a high value. And, in a region where the voltage changes (the transition region), the oxygen flow rate differs as between a case where the voltage is being increased and a case where the voltage is being reduced. Namely, a hysteresis takes place.

Here, in a region where the oxygen flow rate is smaller than the transition region, the deposition rate is high, but the obtainable silicon oxide film tends to be opaque, and the absorption coefficient tends to increase, whereby there will be a drawback that it is not possible to deposit a transparent film. Further, in a region where the oxygen flow rate is larger than the transition region, the obtainable silicon oxide film will be transparent, but there will be a drawback that the deposition rate is very low. On the other hand, in the transition region, there is a merit that a transparent silicon oxide film can be obtained at a high deposition rate.

However, in the transition region, due to the hysteresis, the voltage and the oxygen flow rate are not in a constant relation, whereby it is difficult to control the discharge in a stabilized condition by the voltage and the oxygen flow rate.

As a means to eliminate the influence of the hysteresis in the transition region, control by various closed loops has been proposed (for example, JP-A-5-78836, JP-A-10-8247, JP-A-11-29863).

However, in each of these cases, there is a problem that by an external influence such as abnormal discharge (arcing) or by a measurement error, the control is likely to be erroneous, and the resulting silicon oxide film is likely to be non-uniform. Especially when arcing takes place, the voltage will thereby be decreased, the deposition rate will be decreased, and further, as the oxygen flow rate will also increase, the subsequent control will be impossible. Further, in each of these cases, it is required to carry out feedback control, and the apparatus to be used tends to be accordingly expensive.

Further, WO01/27345 (hereinafter referred to as D1) discloses a method for forming a film containing $SiO_2$ as the main component by a sputtering method in an atmosphere containing an oxidizing gas, employing a sputtering target which contains SiC and metallic Si with an atomic ratio of C to Si being from 0.5 to 0.95 and which has a density of from $2.75 \times 10^3$ kg/m$^3$ to $3.1 \times 10^3$ kg/m$^3$, for the purpose of obtaining a transparent silicon oxide film at a high deposition rate.

Further, JP-A-2003-13216 (hereinafter referred to as D2) discloses a method for forming a transparent thin film by a sputtering method using a reactive gas, as a method for forming a transparent thin film constantly without a hysteresis in the transition region, wherein a compound and/or a mixture containing at least two elements which differ in the transition region wherein the film forming mode changes between a metal mode and a compound mode along with the change in the concentration of the reactive gas, is used as a target.

Further, JP-A-2003-121605, JP-A-2003-121636 and JP-A-2003-121639 disclose an antireflection film, a near infrared protection film and a bandpass filter, characterized in that a low refractive index film and a high refractive index film are alternately deposited on a substrate, wherein the low refractive index film is deposited by sputtering using conductive silicon carbide as the target, and the high refractive index film is deposited by sputtering using conductive titanium oxide as the target.

However, in the method disclosed in D1, sputtering is carried out by a DC sputtering method in a region where the oxygen flow rate is larger than the transition region, whereby the deposition rate is not sufficiently high.

Further, as a result of the study on the method disclosed in D1 by the present inventors, it has been found that a hysteresis occurs in the transition region like in the case where a Si target is employed. Namely, the present inventors have found that when the method disclosed in D1 is employed, it is difficult to control the discharge by the voltage in the transition region under a stabilized condition and that it is difficult to continuously produce a uniform film in the transition region.

Further, as a result of the study on the method disclosed in D2, the present inventors have found that it is possible to deposit a transparent thin film constantly without a hysteresis in the transition region by means of DC pulses, only when the sputtering target area is small and the applied power density is small. This will be specifically described as follows.

Firstly, the present inventors have found that in a case where a sputtering target containing silicon carbide and silicon and having a ratio in number of atoms of C to Si being from 0.5 to 0.95, is employed, it is possible to form a transparent thin film constantly without a hysteresis in the transition region using DC pulses, only when the sputtering target area is small (specifically less than about 300 cm$^2$), and it is impossible to form a film on a substrate having a large area. And, when the target area is the same, the hysteresis tends to be more likely as the power density increases (i.e. as the deposition rate increases). Accordingly, it is possible to deposit a transparent thin film constantly without a hysteresis in the transition region using DC pulses, only when the sputtering target area is small, and the applied power density is small.

In the method disclosed in D2, a sputtering target is employed which contains silicon carbide and silicon, wherein the ratio in the number of atoms of C to Si is 1. Also in this case, it is readily conceivable that a similar phenomenon will occur.

Usually, it is necessary to increase the sputtering target area, in a case where a film is deposited on a substrate having a large area or in a case where the film deposition area is increased in order to improve the productivity. D2 discloses nothing about the sputtering target area, but as mentioned above, from the study by the present inventors, it is readily conceivable that in the method disclosed in D2, a hysteresis is likely to result when the sputtering target area is large (specifically at least about 300 cm$^2$) and when the applied power density is large. Further, it is readily conceivable that in a case where the sputtering target area is small, and the applied power density is small, the hysteresis may disappear, but there will be a problem that the deposition rate is slow, or a transparent film can not be formed.

Further, it is also conceivable that by the method disclosed in D2, the surface roughness of the obtained film tends to be large, and in a case where it is used for an optical multilayer film wherein the number of films to be deposited is large or an optical multilayer film wherein the total film thickness is thick, e.g. when it is used for a bandpass filter, the loss of directly transmitted light will be large due to formation of a haze.

Further, a conductive silicon carbide target is employed for the formation of an antireflection film, etc. as disclosed in JP-A-2003-101605, JP-a-2003-121636 and JP-A-2003-121639. However, the present inventors have found that with such a target, the deposition rate can not be made high.

Whereas, in recent years, there has been development of an optical multilayer film having various optical characteristics, such as one capable of reflecting light having a certain specific wavelength, which is obtainable by alternately depositing a silicon oxide film having a low refractive index and a transparent film such as a $Nb_2O_5$ film or a $Ta_2O_5$ film having a high refractive index. Such an optical multilayer film is obtained by depositing from a few layers to a few hundred layers of transparent films, but it can not be used if a defect such as a non-uniform portion is present even in only one layer among them. Accordingly, for the production of an optical multilayer film, it is strongly desired to develop a method which is capable of depositing a uniform film continuously and repeatedly under the same conditions and also at a high deposition rate.

Accordingly, it is an object of the present invention to provide a method for producing a silicon oxide film, whereby a transparent film having uniform optical constants such as refractive index, absorption coefficient, etc., can be deposited continuously and repeatedly under the same conditions on a substrate having a large area and at a high deposition rate, and a method for producing an optical multilayer film which has the desired performance and which can be used for various applications.

DISCLOSURE OF THE INVENTION

As a result of an extensive study, the present inventors have found that when sputtering is carried out with an alternating current having a specific frequency in an atmosphere containing an oxidizing gas by using a sputtering target which comprises silicon carbide and silicon, wherein the ratio in number of atoms of C to Si is from 0.5 to 0.95, a hysteresis which used to take place in a case where a Si target is employed or in a case where the method disclosed in D1 is carried out, will not substantially occur, and, accordingly, it is possible to easily control the voltage and the oxygen concentration in the transition region. The present invention has been accomplished on the basis of such discoveries.

Namely, the present invention provides the following (1) to (16).

(1) A method for producing a silicon oxide film, which comprises depositing a silicon oxide film on a substrate by carrying out AC sputtering by using a sputtering target comprising silicon carbide and silicon with a ratio in number of atoms of C to Si being from 0.5 to 0.95, in an atmosphere containing an oxidizing gas, with an alternating current having a frequency of from 1 to 1,000 kHz.

(2) The method for producing a silicon oxide film according to the above (1), wherein the sputtering is carried out in a transition region.

(3) The method for producing a silicon oxide film according to the above (1) or (2), wherein the area of the sputtering target is from 300 to 100,000 cm$^2$.

(4) The method for producing a silicon oxide film according to any one of the above (1) to (3), wherein the area of the substrate is from 0.1 to 20.0 m$^2$.

(5) The method for producing a silicon oxide film according to any one of the above (1) to (4), wherein the shape of the sputtering target is cylindrical.

(6) The method for producing a silicon oxide film according to any one of the above (1) to (5), wherein the oxidizing gas is oxygen, and oxygen is contained in an amount of from 35 to 60 vol % in the atmosphere.

(7) The method for producing a silicon oxide film according to any one of the above (1) to (6), wherein the power density against the sputtering target in the sputtering is at least 5 W/cm$^2$.

(8) The method for producing a silicon oxide film according to any one of the above (1) to (7), wherein the deposition rate in the sputtering is at least 40 nm·m/min.

(9) The method for producing a silicon oxide film according to any one of the above (1) to (8), wherein in the silicon oxide film, the $SiO_2$ component is at least 99 mass % based on the entire film.

(10) The method for producing a silicon oxide film according to any one of the above (1) to (9), wherein the silicon oxide film has an absorption coefficient of at most $1 \times 10^{-3}$.

(11) The method for producing a silicon oxide film according to any one of the above (1) to (10), wherein the silicon oxide film has a film thickness of from 5 to 1 μm.

(12) A method for producing an optical multilayer film, which comprises depositing, on a substrate, an optical multilayer film comprising a plural layers of films including at least a silicon oxide film, wherein the silicon oxide film is deposited by the method for producing a silicon oxide film as defined in any one of the above (1) to (11)

(13) The method for producing an optical multilayer film according to the above (12), wherein the optical multilayer film comprises at least 20 layers of films.

(14) The method for producing an optical multilayer film according to the above (12) or (13), wherein any film other than the silicon oxide film contained in the optical multilayer film, is a $Nb_2O_5$ film, a $TiO_2$ film or a $Ta_2O_5$ film.

(15) The method for producing an optical multilayer film according to the above (12), (13) or (14), wherein the optical multilayer film has an absorbance of at most 5% in the entire visible light region.

(16) The method for producing an optical multilayer film according to any one of the above (12) to (15), wherein the application of the optical multilayer film is an anti-reflection film, a dichroic mirror, a ultraviolet/infrared filter or a bandpass filter.

BEST MODE FOR CARRYING OUT THE INVENTION

Figure 1:
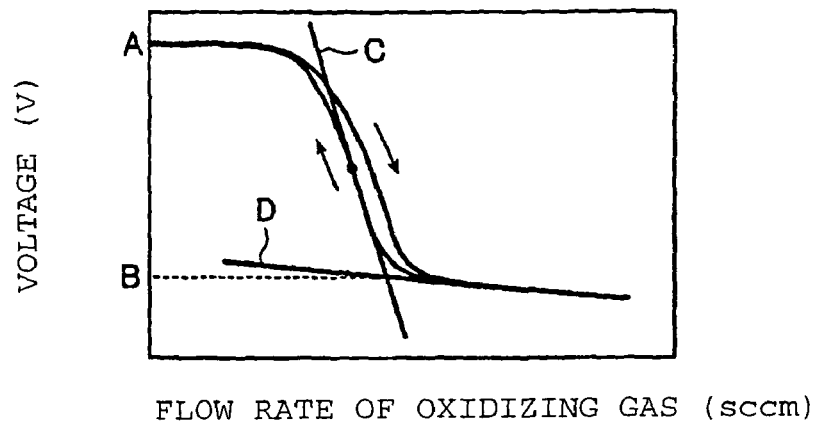
FIG. 1 is a diagrammatical graph (voltage change curve) showing the relation between the voltage and the flow rate of the oxidizing gas in a case where the method for producing a silicon oxide film of the present invention is carried out.

Now, the present invention will be described in detail.

The method for producing a silicon oxide film of the present invention is a method for producing a silicon oxide film, which comprises depositing a silicon oxide film on a substrate by carrying out AC sputtering by using a sputtering target comprising silicon carbide and silicon with a ratio in number of atoms of C to Si being from 0.5 to 0.95, in an atmosphere containing an oxidizing gas, with an alternating current having a frequency of from 1 to 1,000 kHz.

The sputtering target to be used in the present invention comprises silicon carbide (SiC) and silicon (Si).

In the sputtering target to be used in the present invention, the ratio C/Si in number of atoms of C to Si (sum of Si in the SiC and Si in the Si) is at least 0.5, preferably at least 0.7, and at most 0.95, preferably at most 0.9. If the ratio C/Si in number of atoms is too small, Si will be the main component, whereby cracking at grain boundaries of Si particles is likely to readily occur, and the deposition rate tends to be low. On the other hand, also in a case where C/Si in number of atoms is too large, the deposition rate tends to be low.

Specifically, as compared with a case where the ratio C/Si in number of atoms is 1, the deposition rate will be improved at a level of from 1.3 to 1.5 times when the same electric power is applied. Inversely, when the deposition rate is the same, the applied electric power may be reduced to a level of from 1/1.5 to 1/1.3 times.

D1 discloses use of a sputtering target wherein the ratio C/Si in number of atoms is from 0.5 to 0.95 and discloses that the deposition rate can be increased by using this sputtering target.

However, in the DC sputtering method disclosed in D1 the increase in the deposition rate is only about 20% of the case where the ratio C/Si in number of atoms is 1.

Whereas, the effect for increasing the deposition rate in the present invention wherein AC sputtering is carried out with an alternating current having a frequency of from 1 to 1,000 kHz, is very large at a level of at least about 100%.

The density of the sputtering target to be used in the present invention is preferably from $2.75 \times 10^3$ to $3.1 \times 10^3$ kg/$^3$. If the density is within this range, when the ratio C/Si in number of atoms is from 0.5 to 0.95, discharge can be carried out in a stabilized state, and the deposition rate can be increased.

From the viewpoint of the resistivity, discharge stability and thermal conductivity of the sputtering target to be used in the present invention, it is preferred that Si is present to fill spaces of SiC particles and constitutes a continuous phase.

The thermal conductivity of the sputtering target to be used in the present invention is preferably at least 100 W/(m·k). If the thermal conductivity is too low, the sputtering target may locally be heated to a high temperature, whereby a damage such as cracking is likely to occur. Further, due to such local heating of the sputtering target, such a portion tends to be susceptible to oxidation, whereby the deposition rate may sometimes decrease. The higher the thermal conductivity of the sputtering target, the better. However, even if it is made to exceed 200 W/(m·k), there will be no difference in the effect for suppressing such local heating to a high temperature.

In the sputtering target to be used in the present invention, the total of impurities (components other than Si and C) based on the entire sputtering target is preferably less than 1 mass %, with a view to obtaining a film composed mainly of a silicon oxide film having a low refractive index.

The relative density (packing rate) of the sputtering target to be used in the present invention is preferably at least 60% from the viewpoint of the stability of discharge during the film deposition.

Further, the resistivity of the sputtering target to be used in the present invention is preferably at most 0.5 Ω·m from the viewpoint of carrying out AC sputtering, more preferably at most 0.03 Ω·m from the viewpoint of the stability of discharge.

The area of the sputtering target to be used in the present invention is preferably from 300 to 100,000 cm$^2$, more preferably from 500 to 100,000 cm$^2$. Within this range, film deposition on a substrate having a large area can be carried out in a short time.

The sputtering target to be used in the present invention is not particularly limited with respect to the method for its production. For example, it can be produced as follows.

To a SiC powder, a dispersant, a binder (such as an organic binder) and water are added, following by stirring to prepare a SiC slurry. Then, this slurry is poured into a gypsum mold, followed by casting. The cast product is sufficiently dried, and then, removed from the mold to obtain a molded product.

The casting method is an industrially useful molding method from the viewpoint such that it is inexpensive, provides high productivity and is capable of forming a product of an irregular shape rather than a flat plate or a product having a large surface.

In the above example, a casting method is employed to obtain the molded product. Otherwise, a press forming method or an extrusion method may be employed. Further, with respect to the shape of the molded product, a desired shape may suitably be selected, such as a plate shape or a columnar shape.

After obtaining the shaped product, it is dried as the case requires. Further in a case where a sintered body is to be obtained from the molded product, the molded product is sintered in vacuum or in a non-oxidizing atmosphere at a temperature of from 1,450 to 2,300° C. to obtain a sintered product. The sintering temperature is preferably from 1,500 to 2,200° C., more preferably from 1,600 to 1,800° C., whereby pores which are desirable for impregnation of molten Si in the next step, can be formed.

Then, molten Si is impregnated to the obtained molded product or its sintered product in vacuum or in a reduced pressure non-oxidizing atmosphere at from 1,450 to 2,200° C. to fill pores in the molded product or the sintered product with Si to obtain a sputtering target. With a view to suppressing the amount of evaporation of Si while promoting the impregnation of Si, the temperature is preferably from 1,500 to 2,200° C., more preferably from 1,500 to 1,800° C.

A method of impregnating molten Si without sintering the molded product, is excellent in the productivity, since the sintering step is omitted. On the other hand, the method of impregnating molten Si after the molded product is sintered to obtain a sintered product, has a merit in that impurities will be evaporated during the sintering step, whereby a sputtering target having a higher purity can be obtained.

The sputtering target to be used in the present invention, is usually processed into a prescribed size and bonded to a metal backing plate by a bonding material (such as indium) or mechanically secured to an electrode, by e.g. a jig, such as clamping, and then it is used.

The shape of the sputtering target may be planar or columnar. A columnar shape is preferred, since it is thereby possible to use a sputtering method employing a cylindrical rotatable cathode which will be described hereinafter.

The atmosphere (sputtering gas) to be used in the present invention contains an oxidizing gas. The oxidizing gas may, for example, be oxygen, ozone, carbon dioxide gas or a gas mixture thereof (such as a gas mixture of oxygen and ozone).

The atmosphere to be used in the present invention is not particularly limited, so long as it contains the above-mentioned oxidizing gas. For example, a gas mixture of an oxidizing gas and an inert gas may be employed. The inert gas may, for example, be helium, neon, argon, krypton or xenon. Among them, argon is preferred from the viewpoint of the economical efficiency and discharge efficiency. These gases may be used alone or in combination as a mixture of two or more of them.

Among them, a gas mixture of argon gas and oxygen gas is preferred, and particularly preferred is one containing oxygen in an amount of from 35 to 60 vol %.

The substrate to be used in the present invention is not particularly limited, and a conventional one may be used. For example, it may be a glass plate (such as a quartz glass plate), a plastic plate or a plastic film. Especially from the viewpoint of the strength and transparency, it is preferred to employ a glass plate.

The thickness of the substrate is preferably from 0.3 to 20.0 mm, particularly from 0.5 to 10 mm, from the viewpoint of the strength.

In the present invention, it is possible to deposit a film on a small substrate having an area of less than 0.1 m$^2$. However, with a view to fully utilizing the merit of the present invention such that film deposition can be efficiently carried out even on a substrate having a large area, the area of the substrate is preferably from 0.1 to 20.0 m$^2$, more preferably from 0.1 to 10.0 m$^2$, further preferably from 0.1 to 3.0 m$^2$. Further, a substrate having a small area having a silicon oxide film, can efficiency be produced by a method wherein a silicon oxide film is deposited on a substrate having a large area, and the obtained substrate having a large area having a silicon oxide film, is cut, or a method wherein many substrates preliminarily cut into a small size, are fixed on a substrate holder or the like, and using the entirety of this substrate holder or the like as a substrate having a large area, a silicon oxide film is formed thereon.

In the present invention, using the above-described sputtering target, sputtering is carried out with an alternating current having a frequency of from 1 to 1,000 kHz in the above-mentioned atmosphere. The frequency of the alternating current to be used in the present invention is at least 1 kHz, preferably at least 10 kHz, and at most 1,000 kHz, preferably at most 100 kHz. If the frequency is within this range, the discharge will be stable, and it is possible to form a film having uniform optical constants. If a high frequency as used in a RF sputtering method, is used, the apparatus such as the power source is required to be large and expensive.

Further, as compared with a DC sputtering method employing DC pulses, in the AC sputtering method employing a frequency of from 1 to 1,000 kHz, (1) the anode and the cathode are alternately changed, and the anode is always cleaned, whereby discharge instability (arcing) scarcely takes place, and (2) the impedance change due to disappearance of the anode is little, whereby the change with time of the discharge condition is little, and (3) a smooth film having a small surface roughness can be obtained.

In the present invention, sputtering is preferably carried out in a transition region. If sputtering is carried out in the transition region, a transparent silicon oxide film can be obtained at a high deposition rate.

In the present invention, "the transition region" is specifically defined as follows.

FIG. 1 is a diagrammatical graph (voltage change curve) showing the relation between the voltage and the flow rate of an oxidizing gas in a case where the method for producing a silicon oxide film of the present invention is carried out by changing the flow rate of the oxidizing gas in the atmosphere while maintaining the flow rate of gas other than the oxidizing gas in the atmosphere to be constant, under application of a constant electric power.

In FIG. 1, when the flow rate of the oxidizing gas is increased from 0, the voltage decreases, and when the flow rate is further increased, the voltage becomes substantially constant at a low value. Then, when the flow rate of the oxidizing gas is reduced, the voltage will increase, and when the flow rate is further increased, the voltage becomes substantially constant at a high value. Further, in the method for producing a silicon oxide film of the present invention, theoretically, a hysteresis will not be formed, but in reality, a hysteresis will slightly be formed as shown in FIG. 1.

In FIG. 1, the voltage when the flow rate of the oxidizing gas is 0, is designated as A. Further, the tangent line of the voltage change curve when the voltage is substantially constant at a low value, is designated as D, and the tangent line when the absolute value of the inclination is maximum when the flow rate of the oxidizing gas is reduced, is designated as C. The voltage at the intersection of the tangent line C and the tangent line D is designated as B. At that time, "the transition region" is defined to be a region where the voltage is from B to B+(A−B)×0.9.

Namely, "the transition region" means a region of the voltage from B to B+(A−B)×0.9, when B is the voltage at the intersection of the tangent line C and the tangent line D, where the tangent line C is a tangent line where the absolute value of the inclination is maximum in a case where the flow rate of the oxidizing gas is reduced, and the tangent line D is a tangent line of the voltage change curve where the voltage is substantially constant at a low value, and A is the voltage when the flow rate of the oxidizing gas is 0 in the graph showing the relation between the voltage and the flow rate of the oxidizing gas in a case where the method for producing a silicon oxide film of the present invention is carried out by changing the flow rate of the oxidizing gas in the atmosphere while maintaining the flow rate of gas other than the oxidizing gas in the atmosphere to be constant, under a constant applied electric power.

As the electric power to be applied to the sputtering device in the sputtering, the power density against the sputtering target (the applied power divided by the area on the discharge surface side of the target) is preferably at least 5 W/cm$^2$, more preferably at least 10 W/cm$^2$.

The deposition rate is preferably at least 20 nm·m/min, more preferably at least 40 nm·m/min.

In the method for producing a silicon oxide film of the present invention, by carrying out sputtering by the above-described method, the Si component of SiC and Si in the sputtering target is oxidized by the oxidizing gas, whereby a silicon oxide film will be deposited on the above-mentioned substrate. Here, the C component of SiC in the sputtering target, is reacted with the oxidizing gas and converted to $CO_2$ or $CO$, which is removed from the system, for example, by a vacuum pump.

In the method for producing a silicon oxide film of the present invention, substantially no hysteresis will be formed in the transition region. Therefore, sputtering can be carried out at the transition region where the deposition rate is high, and it is unnecessary to employ a closed loop since substantially no hysteresis will occur in the transition region. Accordingly, the method is free from a problem of the case where a closed loop is employed i.e. a problem that the control will be impossible when arcing takes place, or a problem that an expensive apparatus is required.

Thus, by the method for producing a silicon oxide film of the present invention, a uniform film can easily be deposited continuously at a high deposition rate.

Further, by using a columnar sputtering target, it will be possible to use a sputtering method employing a cylindrical rotatable cathode, such being preferred. By the use of such a cylindrical rotatable cathode, the utilization efficiency of the target will be improved, and the cost for material can be reduced. Further, the deposition area where a deposit will be accumulated on the target, will be reduced, whereby arcing and film defects can be reduced, and the capacity utilization of the apparatus will be improved.

The silicon oxide film obtained by the method for producing a silicon oxide film of the present invention, is preferably such that the $SiO_2$ component is at least 99 mass % based on the entire film. The refractive index at a wavelength of 633 nm of the silicon oxide film is preferably at most 1.50, more preferably at most 1.48.

The silicon oxide film preferably contains little or substantially no C component. When the amount of C based on the entire film is not more than 0.2 mass %, a silicon oxide film having a low refractive index and having no substantial absorption of light, can be obtained. Accordingly, the absorption coefficient of the silicon oxide film is preferably at most $1\times10^{-3}$, more preferably at most $5\times10^{-5}$.

The film thickness (geometrical film thickness) of the silicon oxide film is not particularly limited. However, with a view to using it as an antireflection film, the film thickness is preferably from 5 nm to 1 μm, and especially when it is employed as an optical multilayer film, the film thickness is preferably from 5 to 500 nm.

The method for producing a silicon oxide film of the present invention is not particularly limited with respect to the application, and can be used for the production of a silicon oxide film, which has been commonly used. For example, it is suitably employed for the production of optical devices having various optical characteristics.

Further, it is one of preferred embodiments that the method for producing a silicon oxide film of the present invention is used for the method for producing an optical multilayer film of the present invention, which will be described hereinafter.

The method for producing an optical multilayer of the present invention is a method for producing an optical multilayer film, which comprises depositing, on a substrate, an optical multilayer film comprising plural layers of films including at least a silicon oxide film, wherein the silicon oxide film is deposited by the above-mentioned method for producing a silicon oxide film of the present invention.

The substrate to be used for the method for producing an optical multilayer film of the present invention, is the same as described above.

In the method for producing an optical multilayer of the present invention, the optical multilayer film is not particularly limited so long as it has plural layers of films including at least a silicon oxide film.

As a film other than the silicon oxide film contained in the optical multilayer film, a $Nb_2O_5$ film, a $TiO_2$ film or a $Ta_2O_5$ film may, for example, be mentioned. As a method for a producing such a film, a conventional method may be employed. For example, in the case of a $Nb_2O_5$ film, it is possible to employ a method wherein film deposition is carried out by AC sputtering by means of a metallic Nb target. Otherwise, a method which is not commonly known, may be employed. For example, in the case of a $Nb_2O_5$ film, film deposition can be carried out by AC sputtering by means of a niobium oxide ($NbO_x$) target. The film thickness of the film other than the silicon oxide film contained in the optical multilayer film is preferably from 10 to 500 nm. Among optical multilayer films, preferred may, for example, be an optical multilayer film wherein a silicon oxide film and a $Nb_2O_5$ film are alternately deposited, an optical multilayer film wherein a silicon oxide film and a $TiO_2$ film are alternately deposited, or an optical multilayer film wherein a silicon oxide film and a $Ta_2O_5$ film are alternately deposited.

The number of films in the optical multilayer film is not particularly limited so long as it is a plurality of layers, but as a preferred embodiment, it may be at least 20 layers, particularly at least 40 layers and at most 500 layers. With such an embodiment, a merit can certainly be obtained such that a film having uniform optical constants such as refractive index, absorption coefficient, etc. can easily be deposited continuously at a high deposition rate.

Applications of the optical multilayer film are not particularly limited. However, an anti-reflection film, a dichromic mirror, a ultraviolet/infrared filter, a bandpass filter or a high reflector may, for example, be mentioned. From the purpose of such applications, the absorbance in the entire visible light region (wavelength of from 400 to 700 nm, provided that in a case where the film other than the silicon oxide film contained in the optical multilayer film is a $TiO_2$ film, it is a wavelength region of from 420 to 700 nm, because of the absorption by the $TiO_2$ film) is preferably at most 5%.

According to the process for producing an optical multilayer of the present invention, an optical multilayer film having a silicon oxide film, having uniform optical constants, can be easily formed at a high deposition rate.

EXAMPLES

Now, the present invention will be described in further detail with reference to Examples. However, it should be understood that the present invention is by no means restricted thereto.

1-1. Production of Silicon Oxide Film

Example 1

In order to determine the conditions for forming a silicon oxide film on a glass plate by an AC sputtering method, the following test was carried out by using a sputtering apparatus. After supplying Ar gas at a constant flow rate, discharge was carried out while maintaining the applied electric power to be constant. The oxygen flow rate was increased from 0 sccm to 160 sccm at a rate of 10 sccm/5 min, and then, it was reduced to 0 sccm at a rate of 10 sccm/5 min. The change of the voltage during this period was measured. The test conditions are shown below.

Sputtering Target:
  A planar target comprising silicon carbide (SiC and silicon (Si) (silicon carbide (SiC):80 vol %, silicon (Si):20 vol %; ratio C/Si in number of atoms=0.8)
  Density: $3.0 \times 10^3$ kg/m$^3$ (relative density: about 100%)
  Resistivity: $1.2 \times 10^{-3}$ Ω·m.
  Thermal conductivity measured by laser flash method: 150 W/(m·K)
  In the X-ray diffraction analysis, only crystal phases of SiC and Si were observed, and Si was observed to be present to fill spaces of SiC particles and was found to be continuous.
  The amounts of metal impurities by ICP (inductively coupled plasma emission spectrometry were 0.01 mass % of Al, 0.005 mass % of Fe, 0.002 mass % of Ti, 0.001 mass % of Ca, less than 0.001 mass % of Mg, 0.003 mass % of V, less than 0.001 mass % of Cr, 0.002 mass % of Mn and less than 0.001 mass % of Ni, based on the total amount of the target.
  Target area: 2,000 cm$^2$
  Atmosphere: 125 sccm of Ar gas and from 0 to 160 sccm of O$_2$ gas
  Pressure during film formation: $1.7 \times 10^{-3}$ to $2.7 \times 10^{-3}$ hPa
  Frequency of the alternating current: 29 kHz
  Electric power of the AC power source: 12 kW
  Cathode AC power density: 6 W/cm$^2$

Comparative Example 1

In order to determine the conditions for depositing a silicon oxide film on a glass plate by a DC sputtering method by means of DC pulses, the following test was carried out by using a sputtering apparatus. After supplying Ar gas at a constant flow rate, discharge was carried out while maintaining the applied electric power to be constant. The oxygen flow rate was increased from 0 sccm to 80 sccm at a rate of 10 sccm/5 min, and then, reduced to 0 sccm at a rate of 10 sccm/5 min. The change of the voltage during this period was measured. The test conditions are shown below.

Sputtering target: planar polycrystalline Si target
  Target area: 1,350 cm$^2$
  Atmosphere: 125 sccm of Ar gas and from 0 to 80 sccm Of O$_2$ gas
  Pressure during film deposition: $1.7 \times 10^{-3}$ to $2.7 \times 10^{-3}$ hPa
  Frequency of the DC pulses: 50 kHz
  Electric power of DC power source: 3.5 kW
  DC power density: 2.6 W/cm$^2$

Comparative Example 2

A silicon oxide film was deposited in the same manner as in Comparative Example 1 except that as the sputtering target, a target comprising silicon carbide (SiC) and silicon (Si) (silicon carbide (SiC):80 vol %, silicon (Si):20 vol %; ratio C/Si in number of atoms=0.8) was used, the target area was changed to 548 cm$^2$, the DC power density was changed to 3.6 W/cm$^2$, and the maximum value of the oxygen flow rate was 100 sccm, and the change of the voltage during the film deposition was measured.

Comparative Example 3

A silicon oxide film was deposited by the same method as in Example 1 except that as the sputtering target, a polycrystalline Si target was used, the maximum value of the oxygen flow rate was changed to 90 sccm, the electric power of the AC power source was changed to 8 kW, and the cathode AC power density was 4 W/cm$^2$, and the change of the voltage during the film deposition was measured.

Comparative Example 4

A silicon oxide film was deposited by the same method as in Comparative Example 1 except for the following conditions, and the change of the voltage during the film deposition was measured.
  Sputtering target: planar target comprising silicon carbide (SiC) and silicon (Si) (silicon carbide (SiC):80 vol %, silicon (Si):20 vol %; ratio C/Si in number of atoms=0.8)
  Target area: 140 cm$^2$
  Atmosphere: 40 sccm of Ar gas and from 0 to 16 sccm Of O$_2$ gas
  The increasing and decreasing rate of the oxygen flow rate: 1 sccm/3 min
  Pressure during the film formation: $1.3 \times 10^{-3}$ hPa
  Frequency of DC pulses: 40 kHz
  Electric power of DC power source: 0.75 kW
  DC power density: 5.4 W/cm$^2$

Example 2

A transparent silicon oxide film was deposited on a lass plate of 1,200 mm×1,500 mm×1 mm in thickness y an AC sputtering method in the transition region by sing a planar target comprising silicon carbide (SiC) and silicon (Si) (silicon carbide (SiC):80 vol %, silicon (Si):20 vol %; ratio C/Si in number of atoms=0.8). The conditions for depositing the silicon oxide film are shown below.

Conditions for Depositing the Silicon Oxide Film
  Target area: 3,000 cm$^2$
  Atmosphere: 270 sccm of Ar gas and 210 sccm of O$_2$ gas (O$_2$ gas: 44 vol %)
  Pressure during the film deposition: $3.19 \times 10^{-3}$ hPa
  Frequency of the alternating current: 40 kHz
  Electric power of AC power source: 39.1 kW
  Cathode AC power density: 10.3 W/cm$^2$
  Cathode electric power: 31 kW
  Deposition rate: 40.5 nm·m/min
  Content of SiO$_2$ component based on the total film: 99.5 mass %
  Absorption coefficient: $4.3 \times 10^{-5}$

Comparative Example 5

A transparent silicon oxide film was deposited on a glass plate of 1,200 mm×1,500 mm×1 mm in thickness by an AC sputtering method in the transition region by using a planar silicon carbide (SiC) target (silicon carbide (SiC):100 vol %: ratio C/Si in number of atoms=1.00). The deposition conditions were adjusted so that the deposition rate would be the same as in Example 2. The conditions for depositing the silicon oxide film are shown below.

Conditions for Depositing the Silicon Oxide Film
Target area: 3,000 cm$^2$
Atmosphere: 200 sccm of Ar gas and 230 sccm of O$_2$ gas (O$_2$ gas: 54 vol %)
Pressure during the film deposition: 2.49×10$^{-3}$ hPa
Frequency of the alternating current: 40 kHz
Electric power of AC power source: 76.7 kW
Cathode AC power density: 14.8 W/cm$^2$
Cathode electric power: 44.5 kW
Deposition rate: 40.5 nm·m/min 1-2. Voltage Change Curve During the Sputtering The voltage change curves during the sputtering as measured in Example 1 and Comparative Examples 1 to 4 are shown in FIGS. 2 to 6, respectively.

Figure 2:
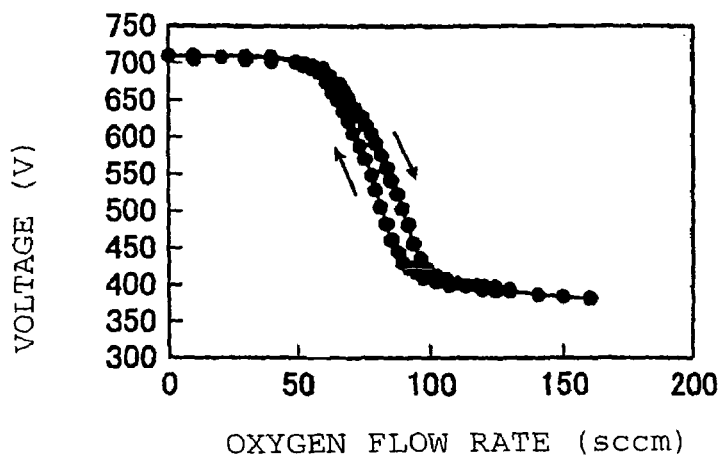
FIG. 2 is a graph showing the voltage change curve during sputtering in Example 1.

As shown in FIG. 2, in the case of the method for producing a silicon oxide film of the present invention (Example 1), it was found that substantially no hysteresis is observed in the transition region of the voltage change curve during the film deposition, the control of discharge can be carried out under a stabilized state even in the transition region, and a transparent silicon oxide film can be produced constantly at a high deposition rate.

Figure 3:
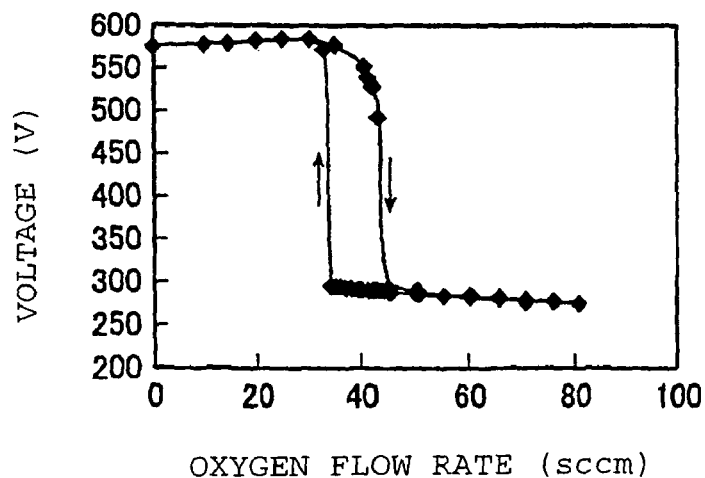
FIG. 3 is a graph showing the voltage change curve during sputtering in Comparative Example 1.
Figure 4:
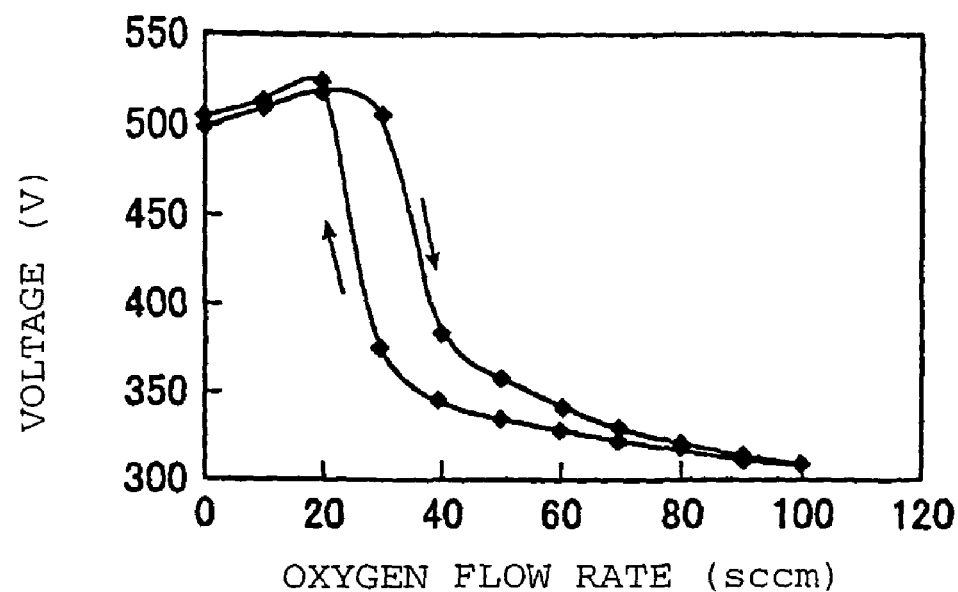
FIG. 4 is a graph showing the voltage change curve during sputtering in Comparative Example 2.
Figure 5:
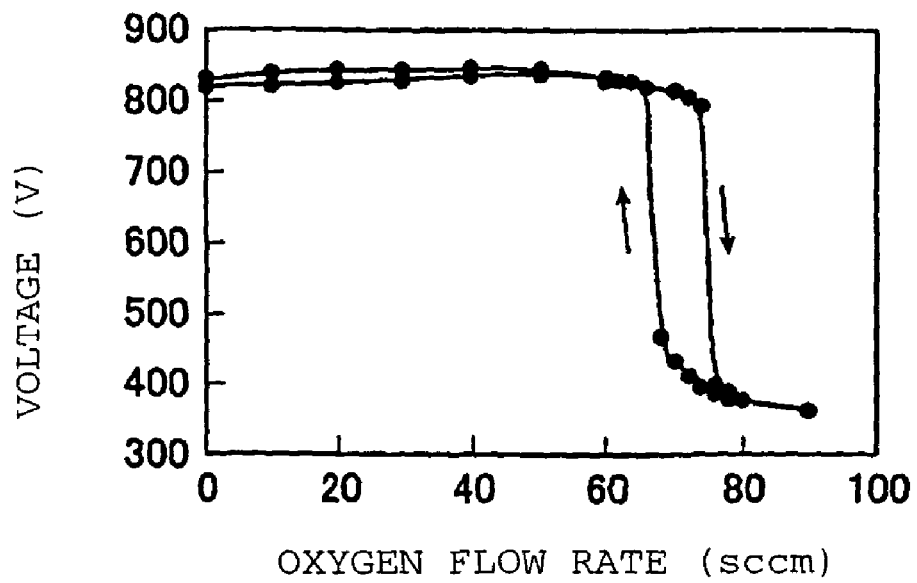
FIG. 5 is a graph showing the voltage change curve during sputtering in Comparative example 3.

Whereas, as shown in FIGS. 3 to 5, in the case where sputtering was carried out with a direct current by means of a Si target (Comparative Example 1), in the case where sputtering was carried out with a direct current (DC pulses) by means of a target comprising silicon carbide and silicon (Comparative Example 2) and in the case where sputtering was carried out with an alternating current by means of a Si target (Comparative Example 3), it was found that in each case, a hysteresis is observed in the transition region, and it is difficult to control the discharge in the transition region, and it is difficult to produce a silicon oxide film constantly in the transition region.

Thus, it is evident that only the method for reducing a silicon oxide film of the present invention can be carried out without receiving influences of various problems caused by a hysteresis.

Figure 6:
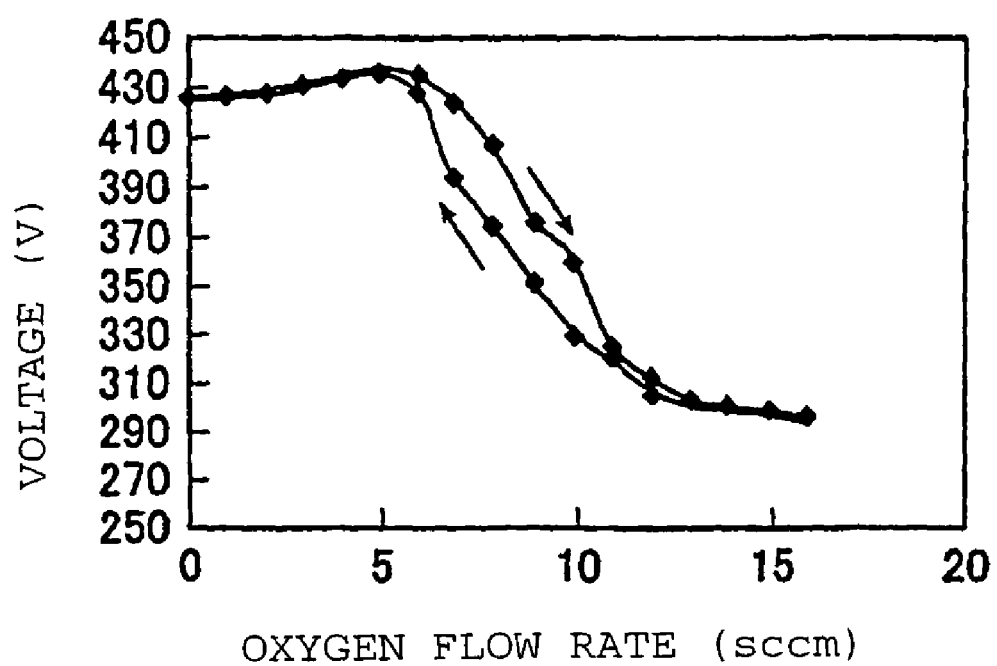
FIG. 6 is a graph showing the voltage change curve during sputtering in Comparative Example 4.

Further, as shown in FIG. 6, even in a case where sputtering is carried out by a direct current (DC pulses) by means of a target comprising silicon carbide and silicon, the hysteresis can be made small if the target area and the applied power density are made small (Comparative Example 4), but in a case where a film is deposited on a substrate having a large area or in a case where the deposition area is made large in order to improve the productivity, it is necessary to increase the target area, and especially when the target area is at least about 500 cm$^2$, a hysteresis is observed as shown in FIG. 4 (Comparative Example 2).

Further, usually, in a case where the target area is the same, a hysteresis is likely to form as the power density increases (as the deposition rate becomes high). Accordingly, if it is attempted to increase the deposition rate, the applied power density is required to be large, whereby a hysteresis is more likely to form.

1-3. Relation Between the Sputtering Target and the Cathode Electric Power

From a comparison between Example 2 and Comparative Example 5, it is evident that in Comparative Example 5, the cathode electric power was 1.44 times as compared with Example 2, when the deposition rate was the same. This means that when the cathode electric power is the same, in Example 2, the deposition rate would be 1.44 times as compared with Comparative Example 5.

Accordingly, it is evident that as compared with a case where the ratio C/Si in number of atoms in the sputtering target is 1.00, in a case where the ratio C/Si in number of atoms in the sputtering target is within the range of the present invention, the deposition rate would be remarkably high.

2-1. Production of Optical Multilayer Film

Example 3

An operation of depositing a Nb$_2$O$_5$ film (film thickness: 10 nm) on a glass plate of 500 mm×200 mm×1.1 mm in thickness by an AC sputtering method in the transition region and depositing a silicon oxide film (film thickness: 10 nm) thereon by an AC sputtering method in the transition region, was repeated to obtain an optical multilayer film wherein the Nb$_2$O$_5$ film and the silicon oxide film were alternately deposited in a total of 40 layers on the glass substrate. The conditions for depositing the Nb$_2$O$_5$ film and the silicon oxide film are shown below.

Conditions for Depositing Nb$_2$O$_5$ film
Sputtering target: metallic Nb target
Atmosphere: 125 sccm of Ar gas and 80 sccm of O$_2$ gas
Pressure during the film deposition: 2.3×10$^{-3}$ hPa
Frequency of the alternating current: 26 kHz
Voltage of AC power source: 277 V
Electric current of AC power source: 48 A
Electric power of AC power source: 12 kW
Cathode voltage: 619 V
Cathode electric current: 24 A
Deposition rate: 42 nm·m/min Conditions for Depositing Silicon Oxide Film
Sputtering target: planar target comprising silicon carbide (SiC) and silicon (Si) (silicon carbide (SiC):80 vol %, silicon (Si):20 vol %; ratio C/Si in number of atoms=0.8)
Atmosphere: 125 sccm of Ar gas and 135 sccm of O$_2$ gas (O$_2$ gas: 52 vol %)
Pressure during the film deposition: 3.3×10$^{-3}$ hPa
Frequency of alternating current: 29 kHz
Voltage of AC power source: 439 V
Electric current of AC power source: 50 A
Voltage of AC power source: 20 kW
Cathode voltage: 456 V
Cathode electric current: 49 A
Deposition rate: 42 nm·m/min Example 4

An operation of forming a Nb$_2$O$_5$ film (film thickness: 10 nm) on a quartz glass plate of 500 mm×250 mm×1.0 mm in thickness by an AC sputtering method and forming a silicon oxide film (film thickness: 10 nm) thereon by an AC sputtering method in the transition region, was repeated to form an optical multilayer film functioning as an ultraviolet/infrared filter, wherein the Nb$_2$O$_5$ film and the silicon oxide film were alternately deposited in a total of 50 layers on the glass substrate. The conditions for depositing the Nb$_2$O$_5$ film and the silicon oxide film are shown below.

Conditions for Depositing Nb$_2$O$_5$ Film
Sputtering target: metallic Nb target
Target area: 2,000 cm$^2$
Atmosphere: 125 sccm of Ar gas and 80 sccm of O$_2$ gas
Pressure during the film deposition: 2.2×10$^{-3}$ hPa
Frequency of the alternating current: 26 kHz
Voltage of AC power source: 371 V
Electric current of AC power source: 60 A
Voltage of AC power source: 20 kW
Cathode voltage: 890 V
Cathode electric current: 30 A
Deposition rate: 21 nm·m/min Conditions for Forming Silicon Oxide Film
  Sputtering target: planar target comprising silicon carbide (SiC) and silicon (Si) (silicon carbide (SiC):80 vol %, silicon (Si):20 vol %; ratio C/Si in number of atoms=0.8)
  Target area: 2,000 cm$^2$
  Atmosphere: 125 sccm of Ar gas and 135 sccm of O$_2$ gas
  Pressure during the film deposition: 3.3×10$^{-3}$ hPa
  Frequency of the alternating current: 29 kHz
  Voltage of AC power source: 439 V
  Electric current of DC power source: 50 A
  Electric power of AC power source: 20 kW
  Cathode voltage: 456 V
  Cathode current flow: 49 A
  Deposition rate: 42 nm·m/min Example 5

An optical multilayer film functioning as a ultraviolet/infrared filter, was obtained in the same manner as in Example 4 except that the conditions for depositing the Nb$_2$O$_5$ film were adjusted as follows.

Conditions for Depositing Nb$_2$O$_5$ Film
  Sputtering target: NbO$_x$ target
  Target area: 2,000 cm$^2$
  Atmosphere: 125 sccm of Ar gas and 24 sccm of O$_2$ gas (corresponding to film deposition in the transition region)
  Pressure during the film formation: 1.9×10$^{-3}$ hPa
  Frequency of the alternating current: 27 kHz
  Voltage of AC power source: 381 V
  Electric current of AC power source: 62 A
  Electric power of AC power source: 21 kW
  Cathode voltage: 1,045 V
  Cathode electric current: 39 A
  Deposition rate: 46 nm·m/min Comparative Example 5

It was attempted to produce an optical multilayer film by the same method as in Example 3 except that as the target to be used for depositing the silicon oxide film, a planar polycrystalline Si target was used, but it was difficult to control the discharge, and it was impossible to obtain an optical multilayer film functioning as a ultraviolet/infrared filter.

2-2. Absorbance Curve of Optical Multilayer Film

With respect to the optical multilayer film obtained in Example 3, the absorbance in a wavelength region of from 300 to 800 nm was measured. The obtained absorbance curve is shown in FIG. 7.

Figure 7:
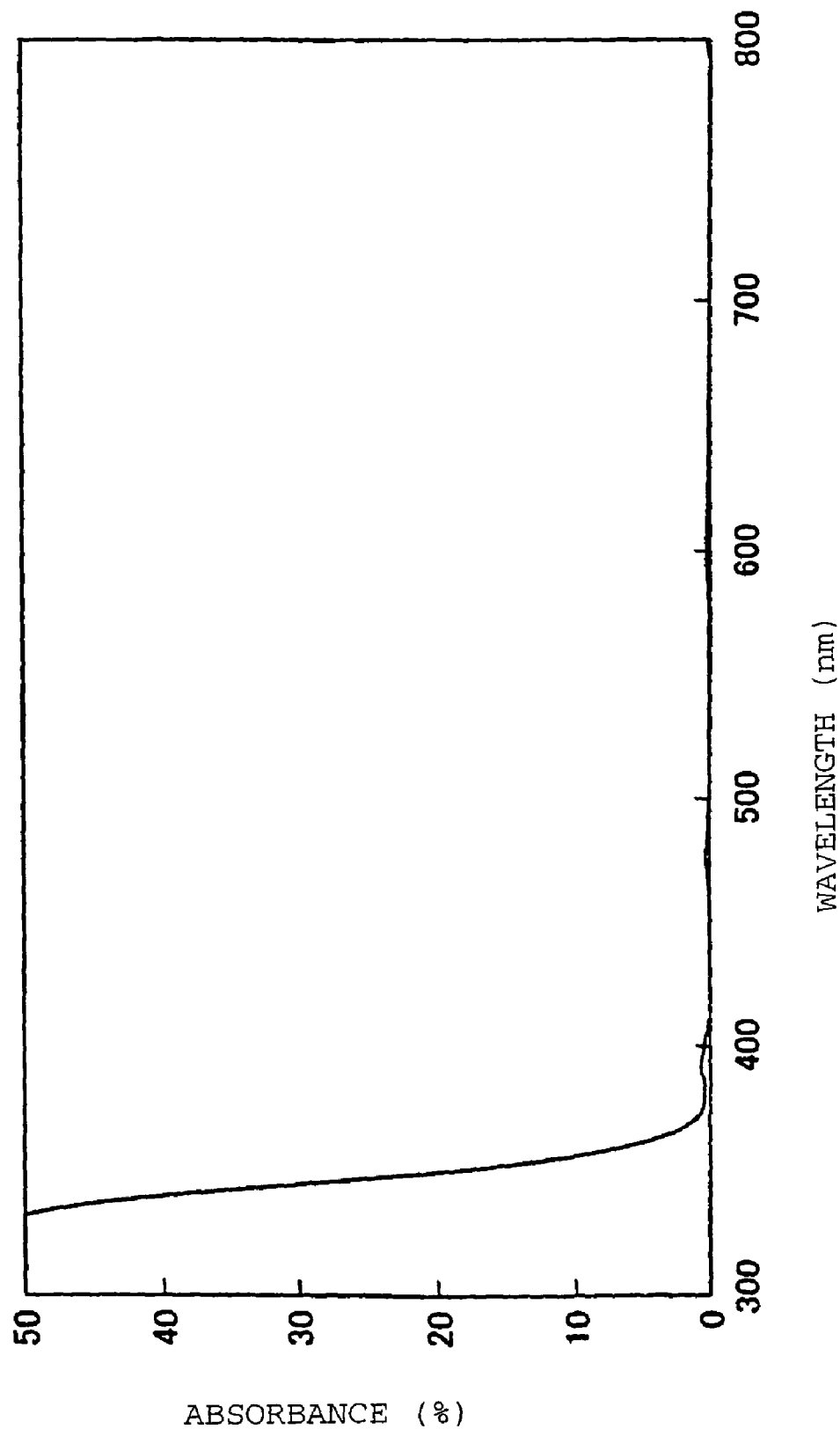
FIG. 7 is a graph showing the absorbance curve of the optical multilayer film obtained by the method for producing an optical multilayer film in Example 3.

In FIG. 7, the absorption at a wavelength of at most 400 nm is the absorption by the glass plate, and it is evident that the absorption by the optical multilayer film is at most 2% in the entire visible light region and is substantially nil. Namely, it is evident that according to the method for producing an optical multilayer film of the present invention, it is possible to obtain a transparent optical multilayer film.

2-3. Spectral Transmittance and Spectral Reflectance of the Ultraviolet/Infrared Filter With respect to the optical multilayer film functioning as the ultraviolet/infrared filter, obtained in Example 4 and 5, the spectral transmittance and the spectral reflectance were measured in the wavelength region of from 300 to 1,200 nm. The results are shown in FIGS. 8 and 9.

Figure 8:
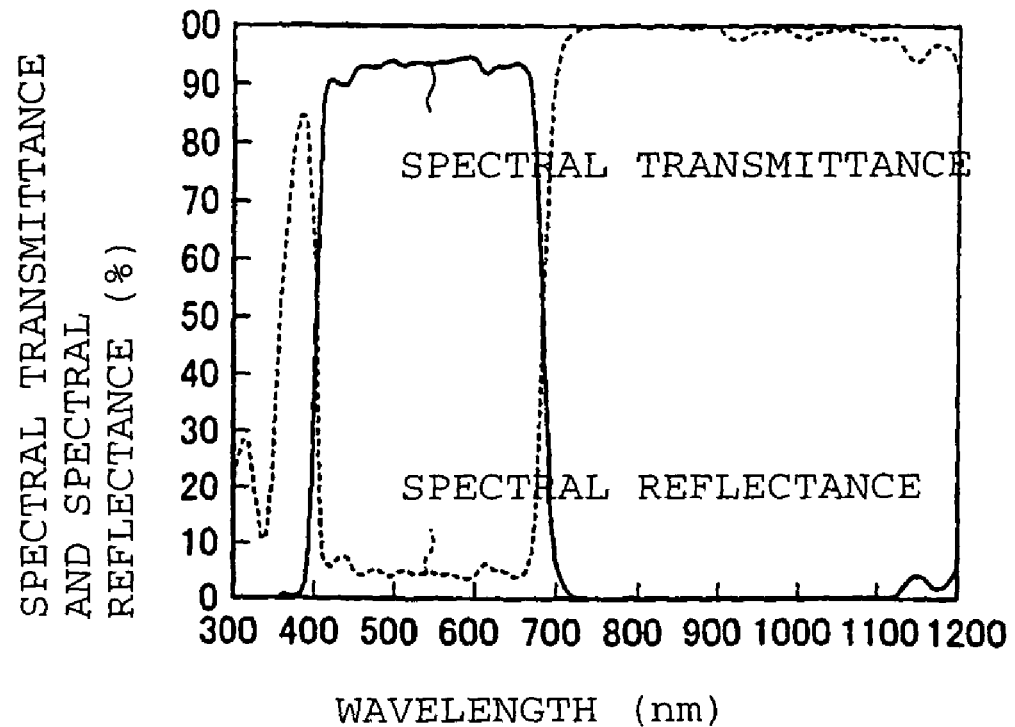
FIG. 8 is a graph showing the spectral transmittance and the spectral reflectance of an optical multilayer film which functions as an ultraviolet/infrared filter obtained by the method for producing an optical multilayer in Example 4.
Figure 9:
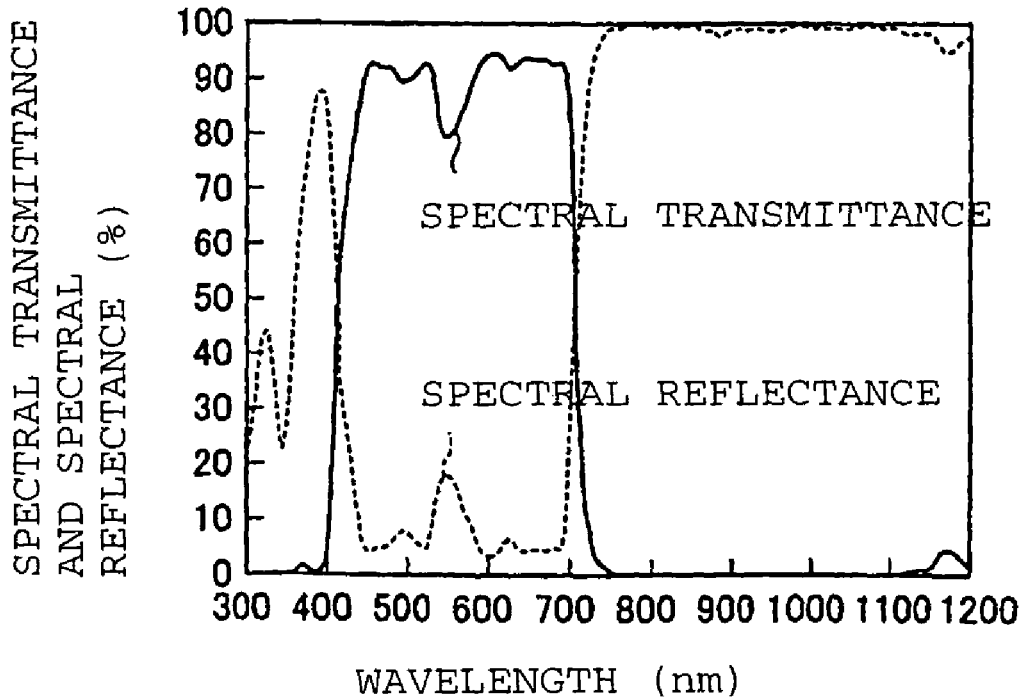
FIG. 9 is a graph showing the spectral transmittance and the spectral reflectance of an optical multilayer film which functions as an ultraviolet/infrared filter obtained by the method for producing an optical multilayer in Example 5.

From FIGS. 8 and 9, it is evident that with the ultraviolet/infrared filter obtained by the method for producing an optical multilayer film of the present invention, the transmittance in the entire region of the ultraviolet region and the infrared region is at most 5%, and lights in the ultraviolet region and infrared region are completely shielded.

3-1. Production of Silicon Oxide Film by Means of a Cylindrical Rotatable Cathode Example 6

In order to determine the conditions for depositing a silicon oxide film on a glass plate by an AC sputtering method, the following test was carried out by means of a sputtering apparatus. In the sputtering apparatus, two cylindrical rotatable cathodes and an AC power source to apply an AC voltage thereto, were set. After supplying Ar gas at 300 sccm, discharge was carried out while maintaining the applied electric power to be constant (18 kW). Ar gas was reduced and oxygen gas was increased at a rate of 10 sccm/5 min, so that the sum of the flow rates of Ar gas and oxygen gas would be 300 sccm. After the Ar gas flow rate became 0 sccm, and the oxygen gas flow rate became 300 sccm, inversely, Ar gas was increased at a rate of 10 sccm/5 min, and oxygen gas was reduced, so that the sum of flow rates of Ar gas and oxygen gas would be 300 sccm.

The test conditions are shown below.
Sputtering Target:
  Columnar target comprising silicon carbide (SiC) and silicon (Si) (silicon carbide (SiC):80 vol %, silicon (Si):20 vol %; ratio C/Si in number of atoms=0.8)
  Density: 3.0×10$^3$ kg/m$^3$ (relative density: about 100%)
  Resistivity: 1.2×10$^{-3}$ Ω·m
  Thermal conductivity measured by a laser flash method: 150 W/(m·K)
  In the X-ray diffraction analysis, only the crystal phases of SiC and Si were observed, and Si was present to fill spaces among SiC particles and constituted a continuous phase.
  The amounts of metal impurities by ICP (induction coupled plasma emission spectrometry) were 0.01 mass % of Al, 0.005 mass % of Fe, 0.002 mass % of Ti, 0.001 mass % of Ca, less than 0.001 mass % of Mg, 0.003 mass % of V, less than 0.001 mass % of Cr, 0.002 mass % of Mn, and less than 0.001 mass % of Ni.
  Target area: 3,580 cm$^2$
  Atmosphere: from 0 to 300 sccm of Ar gas and from 0 to 300 sccm of O$_2$ gas
  Pressure during the film deposition: 2.4×10$^{-3}$ to 3.7×10$^{-3}$ hPa
  Frequency of the alternating current: 29 to 36 kHz
  Electric power of AC power source: 18 kW
  The rotational speed of the columnar target: 10 rpm 3-2. Voltage Change Curve During the Sputtering The voltage change curve during sputtering as measured in Example 6 is shown in FIG. 10.

Figure 10:
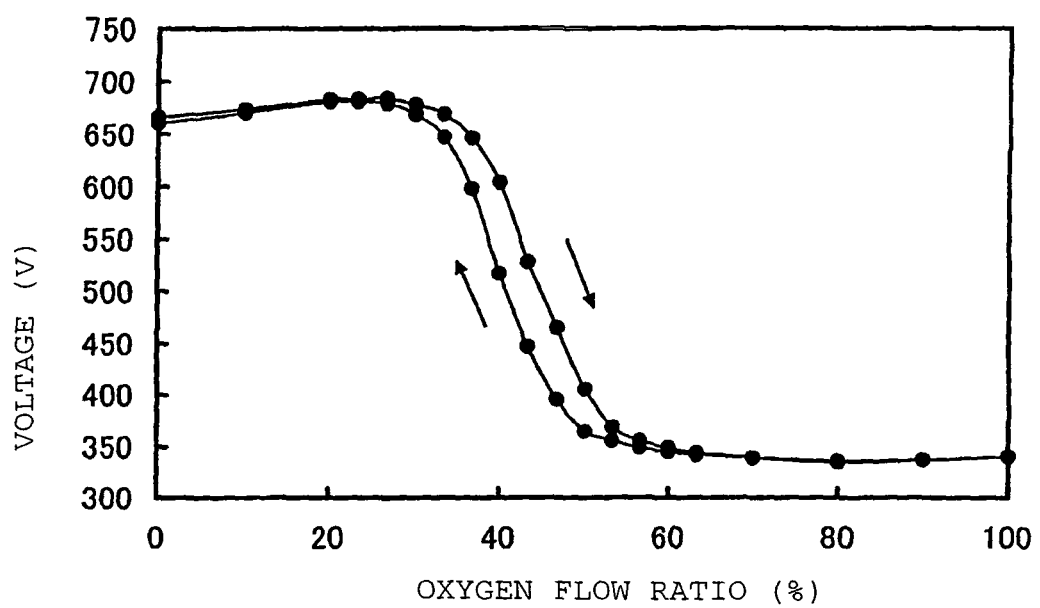
FIG. 10 is a graph showing the voltage change curve during sputtering in Example 6.

As shown in FIG. 10, it was found that in a case where the method for producing a silicon oxide film of the present invention was carried out by means of a cylindrical rotatable cathode (Example 6), substantially no hysteresis was observed in the transition region of the voltage change curve during the film deposition, and even in the transition region, it is possible to control the discharge under a stabilized state, and it is possible to produce a transparent silicon oxide film constantly at a high deposition rate.

INDUSTRIAL APPLICABILITY

According to the method for producing a silicon oxide film of the present invention, a film having uniform optical characteristics can be easily deposited continuously at a high deposition rate. Further, according to the method for producing an optical multilayer film of the present invention, an optical multilayer film having a silicon oxide film, having uniform optical constants, can be easily deposited at a high deposition rate.

The entire disclosures of Japanese Patent Application No. 2003-121527 filed on Apr. 25, 2003 and Japanese Patent Application No. 2003-339748 filed on Sep. 30, 2003 including specifications, claims, drawings and summaries are incorporated herein by reference in their entireties.

What is claimed is:

1. A method for producing a silicon oxide film, comprising:
providing a sputtering target comprising silicon carbide and silicon such that the spattering target has a ratio in number of atoms of C to Si in a range of 0.5 to 0.95;
determining conditions for a transition region in which AC sputtering is to be carried out using the sputtering target and alternating current of a frequency in a range of 1 kHz to 1,000 kHz in a sputtering atmosphere including an oxidizing gas substantially without generating hysteresis; and
carrying out AC sputtering in the transition region based on the conditions using the sputtering target and alternating current of a frequency in the range in the sputtering atmosphere such that a transparent silicon oxide film is deposited on a substrate,
wherein the transition region is in a voltage region from B to B+(A−B)×0.9 where A is a voltage when the flow rate of the oxidizing gas is 0, and B is a voltage at an intersection of tangent lines of a voltage change curve obtained when a voltage become substantially constant at a low value and when a voltage has a maximum absolute value of inclination during reduction of the flow rate of the oxidizing gas, and the flow rate of the oxidizing gas is controlled to change in a range such that the flow rate of the oxidizing gas is increased toward the voltage of B and that the flow rate of the oxidizing gas is decreased toward the voltage of A.

2. The method for producing a silicon oxide film according to claim 1, wherein an area of the substrate is in a range of 0.1 to 20.0 $m^2$.

3. The method for producing a silicon oxide film according to claim 1, wherein a shape of the sputtering target is columnar.

4. The method for producing a silicon oxide film according to claim 1, wherein the oxidizing gas is oxygen, in an amount of 35 to 60 vol %.

5. The method for producing a silicon oxide film according to claim 1, wherein a power density against the sputtering target is at least 5 $W/cm^2$.

6. The method for producing a silicon oxide film according to claim 1, wherein a deposition rate in the sputtering is at least 20 nm·m/min.

7. The method for producing a silicon oxide film according to claim 1, wherein in the silicon oxide film, a $SiO_2$ component is at least 99 mass % based on an entire mass of the silicon oxide film.

8. The method for producing a silicon oxide film according to claim 1, wherein the silicon oxide film has an absorption coefficient of at most $1 \times 10^{-3}$.

9. The method for producing a silicon oxide film according to claim 1, wherein the silicon oxide film has a film thickness in a range of 5 nm to 1 μm.

10. A method for producing an optical multilayer film, comprising:
providing a sputtering target comprising silicon carbide and silicon such that the spattering target has a ratio in number of atoms of C to Si in a range of 0.5 to 0.95;
determining conditions for a transition region in which AC sputtering is to be carried out using the sputtering target and alternating current of a frequency in a range of 1 kHz to 1,000 kHz in a sputtering atmosphere including an oxidizing gas substantially without generating hysteresis;
carrying out AC sputtering in the transition region based on the conditions using the sputtering target and alternating current of a frequency in the range in the sputtering atmosphere such that a transparent silicon oxide film is deposited on a substrate; and
forming on the substrate an optical multilayer film comprising a plurality of layers including the transparent silicon oxide film,
wherein the transition region is in a voltage region from B to B+(A−B)×0.9 where A is a voltage when the flow rate of the oxidizing gas is 0, and B is a voltage at an intersection of tangent lines of a voltage change curve obtained when a voltage become substantially constant at a low value and when a voltage has a maximum absolute value of inclination during reduction of the flow rate of the oxidizing gas, and the flow rate of the oxidizing gas is controlled to change in a range such that the flow rate of the oxidizing gas is increased toward the voltage of B and that the flow rate of the oxidizing gas is decreased toward the voltage of A.

11. The method for producing an optical multilayer film according to claim 10, wherein the optical multilayer film includes at least 20 layers of films.

12. The method for producing an optical multilayer film according to claim 10, wherein any film other than the silicon oxide film contained in the optical multilayer film, is one of a $Nb_2O_5$ film, a $TiO_2$ film and a $Ta_2O_5$ film.

13. The method for producing an optical multilayer film according to claim 10, wherein the optical multilayer film has an absorbance of at most 5% in an entire visible light region.

14. The method for producing an optical multilayer film according to claim 10, wherein the optical multilayer film is at least one of an anti-reflection film, a dichroic mirror, a ultraviolet/infrared filter and a bandpass filter.

15. The method for producing a silicon oxide film according to claim 1, wherein the sputtering target has a thermal conductance of at least 100 W/(m·k).

16. The method for producing an optical multilayer film according to claim 10, wherein the sputtering target has a thermal conductance of at least 100 W/(m·k).

17. The method for producing a silicon oxide film according to claim 1, wherein a resistivity of the sputtering target is at most 0.5 Ohms/m.

18. The method for producing an optical multilayer film according to claim 10, wherein a resistivity of the sputtering target is at most 0.5 Ohms/m.

19. The method for producing an optical multilayer film according to claim 1, wherein the flow rate of the oxidizing gas is controlled to change in a range from 0 sccm to 160 sccm, and the spattering target has an area in a range of 300 $cm^2$ to 100,000 $cm^2$.

20. The method for producing an optical multilayer film according to claim 10, wherein the flow rate of the oxidizing gas is controlled to change in a range from 0 sccm to 160 sccm, and the spattering target has an area in a range of 300 $cm^2$ to 100,000 $cm^2$.

* * * * *